(12) United States Patent
Estep et al.

(10) Patent No.: US 6,353,313 B1
(45) Date of Patent: Mar. 5, 2002

(54) REMOTE, WIRELESS ELECTRICAL SIGNAL MEASUREMENT DEVICE

(75) Inventors: Randy Estep; Dennis Zimmerman, both of Harrisonburg, VA (US)

(73) Assignee: Comsonics, Inc., Harrisonburg, VA (US)

( * ) Notice: Subject to any disclaimer, the term of this patent is extended or adjusted under 35 U.S.C. 154(b) by 0 days.

(21) Appl. No.: 09/266,318

(22) Filed: Mar. 11, 1999

Related U.S. Application Data

(63) Continuation-in-part of application No. 08/927,465, filed on Sep. 11, 1997.
(60) Provisional application No. 60/118,108, filed on Feb. 1, 1999.

(51) Int. Cl.[7] .............................................. G01P 15/00
(52) U.S. Cl. .................................... 324/160; 324/158.1
(58) Field of Search .............................. 324/158.1, 160; 364/514 R; 379/110.01, 21, 93.01; 381/74

(56) References Cited

U.S. PATENT DOCUMENTS

| | | | |
|---|---|---|---|
| 4,573,187 A | 2/1986 | Bui et al. ...................... 381/43 |
| 4,766,529 A | 8/1988 | Nakano et al. ........... 364/513.5 |
| 4,931,950 A | 6/1990 | Isle et al. ................... 364/513 |
| 5,276,471 A | 1/1994 | Yamauchi et al. ........... 351/153 |
| 5,281,957 A | 1/1994 | Schoolman .................... 345/8 |
| 5,291,285 A | 3/1994 | Yokoyama et al. .......... 348/180 |
| 5,305,244 A | 4/1994 | Newman et al. ......... 364/708.1 |
| 5,321,416 A | 6/1994 | Bassett et al. ................. 345/8 |
| 5,408,582 A | 4/1995 | Colier ....................... 395/2.52 |
| 5,426,450 A | 6/1995 | Drumm ..................... 345/168 |
| 5,450,596 A | 9/1995 | Felsenstein ................. 395/800 |
| 5,506,332 A | 4/1996 | Funhoff et al. ............. 528/232 |
| 5,528,255 A | 6/1996 | Hagimori ..................... 345/35 |
| 5,528,660 A * | 6/1996 | Heins et al. .................. 379/21 |
| 5,581,492 A | 12/1996 | Janik ....................... 364/708.1 |
| 5,671,158 A * | 9/1997 | Fournier et al. ........ 364/514 R |
| 5,933,479 A * | 8/1999 | Michael et al. ........ 379/110.01 |
| 5,982,904 A * | 11/1999 | Eghtesadi et al. ............. 381/74 |
| 6,046,712 A * | 4/2000 | Beller et al. ................... 345/8 |

* cited by examiner

Primary Examiner—Safet Metjahic
Assistant Examiner—Jimmy Nguyen
(74) Attorney, Agent, or Firm—Welsh & Katz, Ltd.; Eric D. Cohen

(57) ABSTRACT

A remote, wireless electrical signal measurement device for measuring and adjusting a component in a communications system. The device includes a source device, a remote system and a base system. The device permits a technician wearing the remote system to control through verbal commands the measurement and adjustment of a source device operably attached to the base system.

5 Claims, 17 Drawing Sheets

TEST INSTRUMENT

REMOTE, WIRELESS ELECTRICAL SIGNAL MEASUREMENT DEVICE

REFERENCE TO RELATED APPLICATION

The present application is a continuation-in-part of Ser. No. 08/927,465, which was filed on Sept. 11, 1997, and which is pending as of the filing of the present application, and provisional application Ser. No. 60/118,108, which was filed on Feb. 1, 1999, and which is pending as of the filing of the present application.

BACKGROUND OF THE INVENTION

The present invention generally relates to a wireless control system for measuring or adjusting the characteristics of electrical signals. More particularly, present invention relates to a wireless, hands-free control system for remote measurement and adjustment of electrical signals in a telecommunications system.

In various areas in the telecommunications field it is necessary to use radio frequency (RF) signal level meters to evaluate and monitor the performance of equipment in a telecommunications network. Signal level meters typically include a display or meter movement. These devices are typically operated by some form of mechanical switching; e.g., keyboards, buttons, knobs, or the like.

Signal level meters are typically carried to the location where it is desired to use the device. Once in place the operator controls the mechanical switching components by hand.

The size and weight of the signal level meters impede the use of such devices in certain applications. For example, carrying the signal level meter to the top of an antenna that extends several hundred feet into the air greatly increases the physical exertion of the service technician. The service technician must also use his or her hands to transport the signal level meter while ascending and descending the antenna. This situation creates a safety hazard because the service technician is not able to use both hands while climbing to protect against accidental fall. Once in position to perform the service, it is necessary for the service technician to manipulate the controls using his or her hands. Such a situation also raises the likelihood that the service technician will experience an accidental fall.

To alleviate the need to transport the signal level meter to the location where the telecommunication adjustment or measurement occurs, a process has been developed where a first service technician climbs the antenna with a cordless communication device such as is commonly called a walkie-talkie. A second service technician, who is in communication with the first service technician using a cordless communication device, remains on the ground proximate the signal level meter. Adjustment and measurement of the telecommunication signal is performed by the interaction of the two service technicians.

Fournier et al., U.S. Pat. No. 5,671,158, discloses an apparatus for use in conjunction with motor vehicle emission control systems testing. The Fournier et al. apparatus includes a base unit that is connected to an automobile to measure the idle speed and exhaust constituents. The base unit is linked to a remote unit worn by a technician. The remote unit includes a display, a microphone and a speaker. The Fournier et al. apparatus allows the technician to move around the automobile with the performance of the vehicles emission control systems is evaluated.

Newman et al., U.S. Pat. No. 5,305,244, discloses a self-contained portable computer that is worn by a person. The computer includes a microphone, earphones and a display that is mounted proximate to the user's eye. The Newman et al. computer includes voice recognition for controlling the operation of the computer with voice commands.

SUMMARY OF THE INVENTION

The present invention is a remote, wireless, electrical signal measurement device for measuring and adjusting components in a communications system. The device includes a source device, a base unit and a remote unit.

The source device is capable of generating a data output and receiving a data input. The base system is operably connected to the source device. The base system includes an interface unit, a modulator, a first antenna, and a receiver/demodulator. The interface unit interprets the data output and the data input. The modulator formats the interpreted output data into a first data signal. The first antenna transmits the first data signal and receives a second data signal. The receiver/demodulator formats the second data signal to the input signal.

The remote system includes a second antenna, a second receiver/demodulator, a speaker, a body mounted display, a microphone, and a second modulator. The second antenna transmits the second data signal and receives the first data signal. The second receiver/demodulator formats the first data signal to a demodulated signal. The speaker emits an audio portion of the demodulated signal. The body mounted display displays a video portion of the demodulated signal. The microphone generates an outgoing signal for controlling the measurement and adjustment of the source device. The second modulator formats the outgoing signal to the second data signal.

DETAILED DESCRIPTION OF THE PREFERRED EMBODIMENTS

Figure 1:
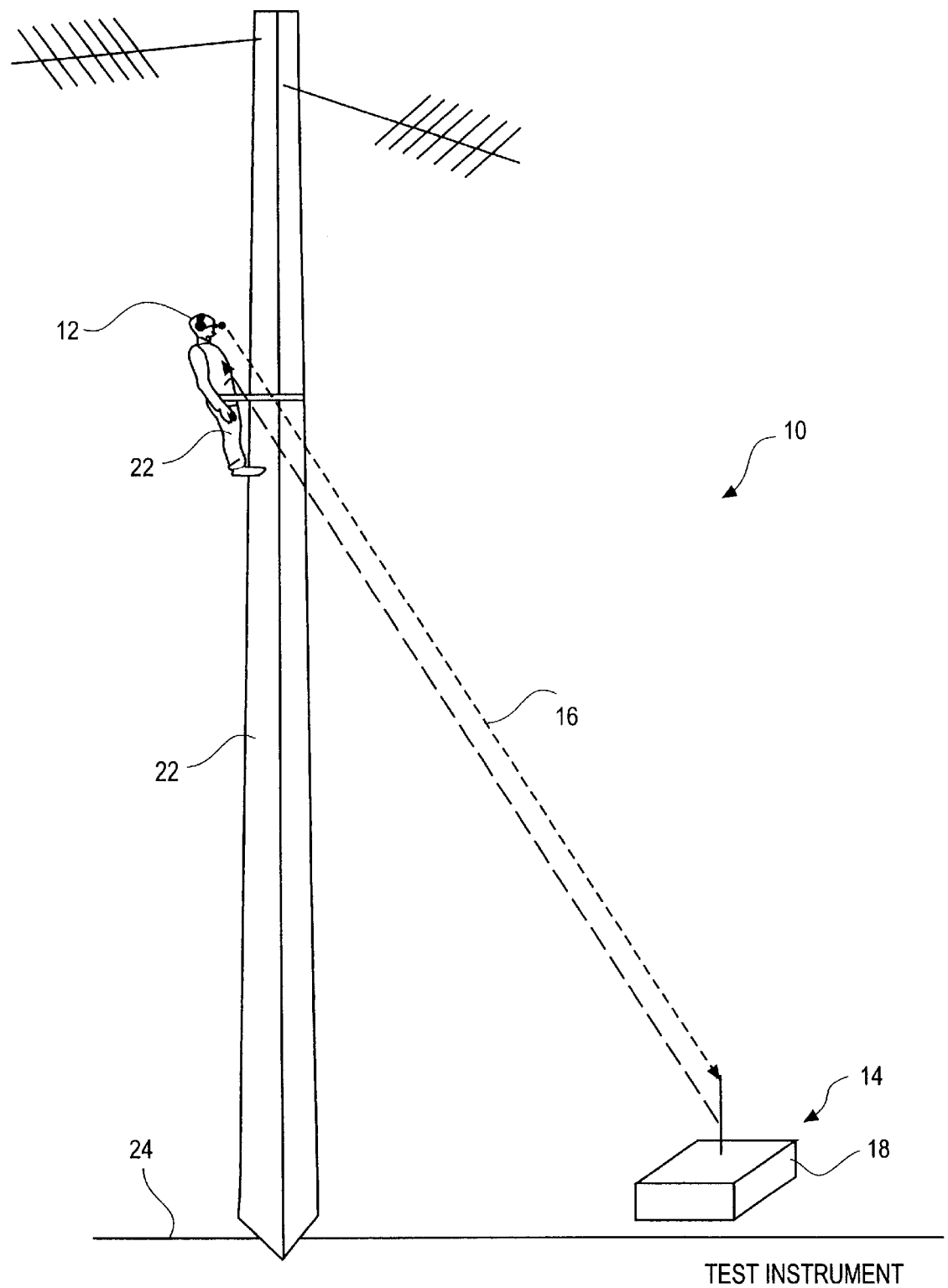
FIG. 1 is a pictorial view of a control system of the present invention used in conjunction with a technician on an antenna.

The present invention is a wireless, hands-free control device as most clearly illustrated in FIG. 1. The control device 10 generally includes a remote unit 12 and a base unit 14 that are operably connected with a wireless link 16. The remote unit 12, which is worn by a service technician 20, communicates with the base unit 14, which is linked to a source device 18, which includes monitoring equipment of types know to persons having skill in the art.

Figure 2:
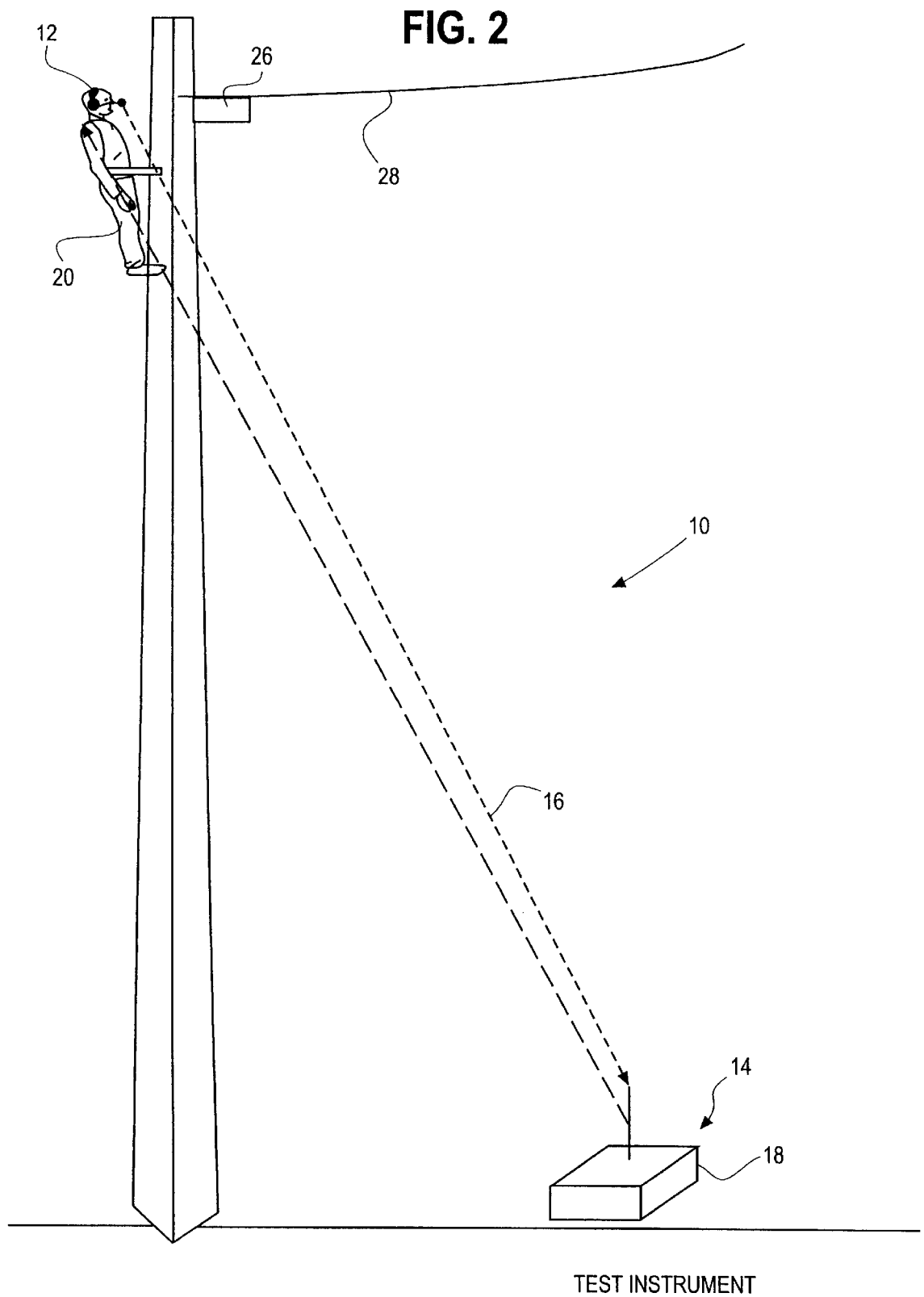
FIG. 2 is a pictorial view of the control system used in conjunction with a cable television network.

The control device 10 enables a single service technician 20 to measure and adjust characteristics of a telecommunications system that includes a relatively tall antenna 22 such as one that extends several hundred feet above a ground surface 24 to which the antenna 22 is mounted. The control device 10 permits the service technician 20 to perform these operations using the remote unit 12 while positioned on the antenna 22 a significant distance above the ground surface 24 where the base unit 14 and other monitoring equipment 18 is located. It is also possible to utilize the concepts of the present invention in other types of communications networks such as adjusting repeaters or amplifiers 26 in cable television distribution lines 28, such as is illustrated in FIG. 2.

The control device 10 further allows the technician 20 to control the measurement and adjustment process through verbal commands. As such, the technician's hands are available to perform adjustment operations as well as to stabilize the technician 20 during the measurement and adjustment processes.

Figure 3:
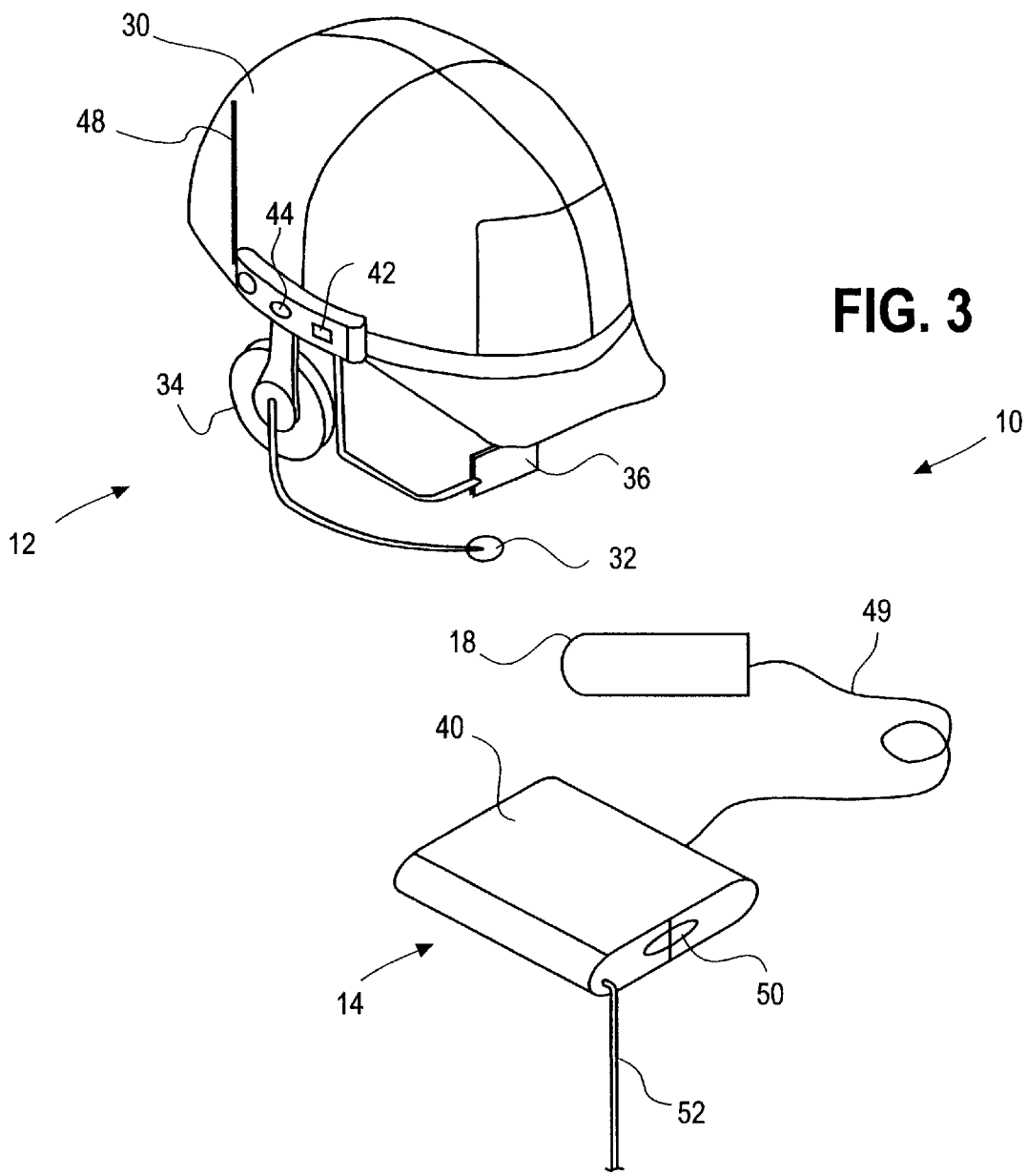
FIG. 3 is a pictorial view of a remote unit of the control system.

The remote unit 12 preferably includes a hard hat 30, of the type generally worn by technicians in the field, that is fitted with a microphone 32 and a head phone (or alternatively an earphone) 34 of conventional design, such as is illustrated in FIG. 3. The remote unit 12 also includes a display device 36 mounted to the hard hat 30. The display device 36 is preferably manufactured using liquid crystal display (LCD), light emitting diode display (LED), cathode ray tube display (CRT), plasma display, phosphor on gate array, or other suitable display technology.

Figure 4:
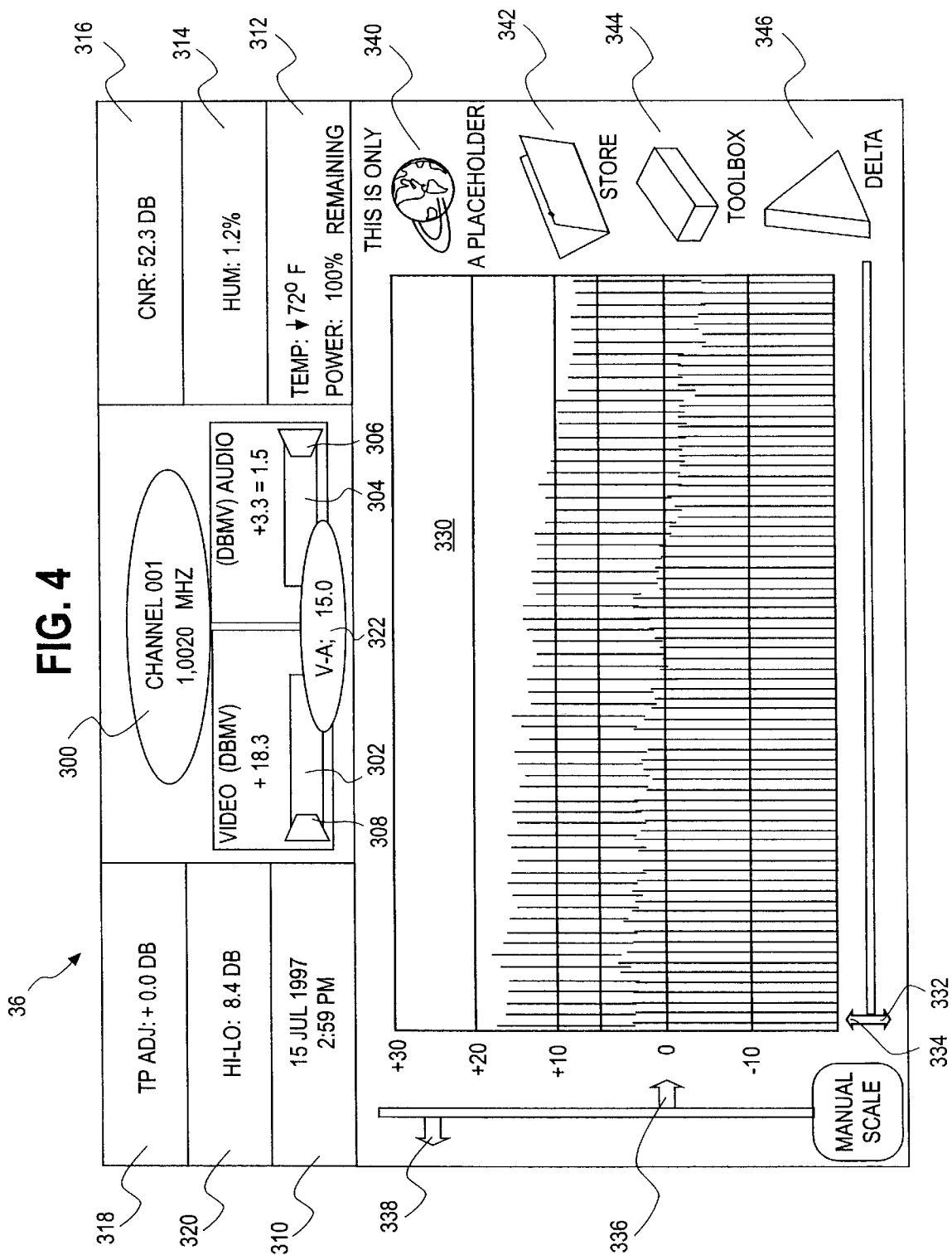
FIG. 4 is a front view of a display portion of the remote unit.

When viewing the display device 36, the technician 20 sees an image of a computer display screen, such as is shown in FIG. 4. The technician 20 may activate various commands to perform a measurement or adjustment by spoken words that are converted to electrical signals by the microphone 32 and transmitted by a cable 38 to the remote unit 12, such as is illustrated in FIG. 3.

Since the control device 10 is configured to permit measurement and adjustment of the telecommunications system to be controlled through verbal commands, the remote unit 12 includes only a minimum of controls, such as an on/off power switch 42. The remote unit 12 may also include a cursor control 44 for manually controlling a displayed pointing cursor. The cursor control 44 may be used as backup to the speech commands.

The remote unit 12 includes a CPU and supporting chip set and other chips specific to the signal level meter speech recognition and synthesis functions. Power for the remote unit 12 is preferably provided through a battery (not shown) that is mounted internal to the remote unit 12. A person of ordinary skill in the art will appreciate that it is also possible to use a separate battery unit (not shown). In such systems, the separate battery unit (not shown) is preferably attached to the technician's belt and connected to the remote unit 12 by a power cable (not shown).

The remote unit 12 preferably includes an antenna 48 that at least partially extends outside the remote unit 12. A person of ordinary skill in the art will appreciate that the type and size of antenna 48 used with the remote unit 12 is selected based on a distance between the remote unit 12 and the base unit 14.

The base unit 14 includes a CPU and supporting chip set. The base unit 14 is connected to the source unit, or monitoring equipment, 18 by a cable 48 that enables the technician to take additional measurements of the communications network proximate to where the adjustments are made.

The base unit 14 also includes an antenna 52 for communicating with the remote unit 12. The base unit 14 may also include a serial connector 50 that provides an interface to a desktop computer or other data collection system to allow down loading of data from the signal level meter to a central database and up loading of software upgrades.

Figure 5:
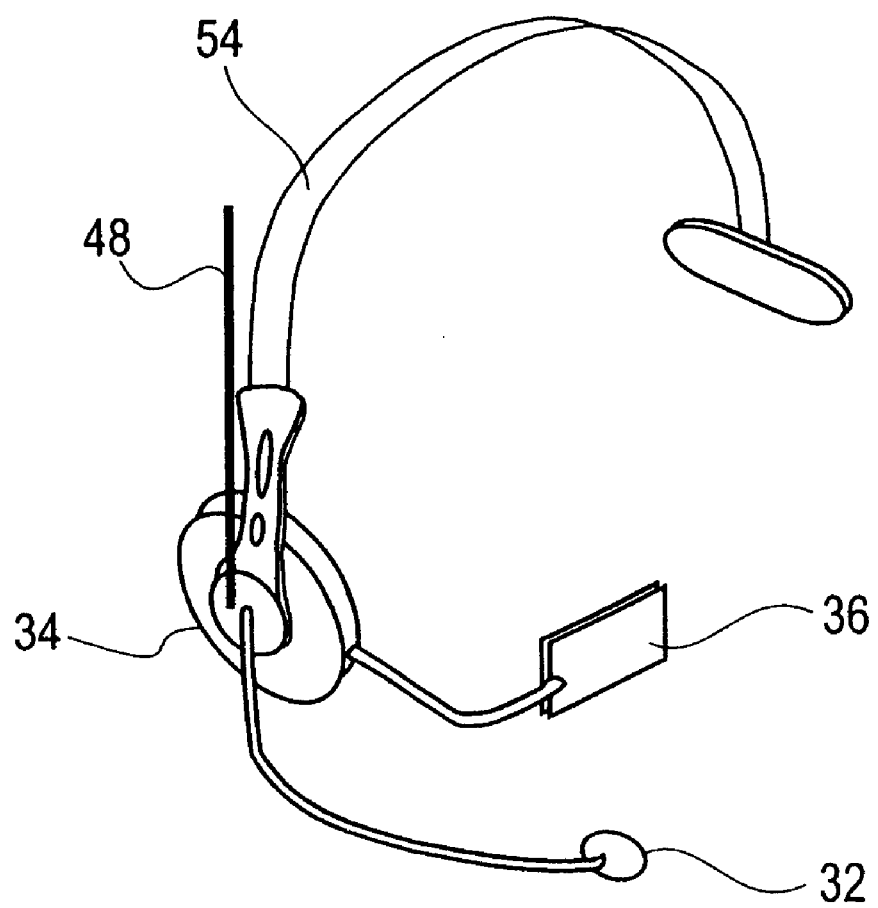
FIG. 5 is a pictorial view of an alternative embodiment of a head piece portion of the remote unit.

The microphone 32, the head phone 34, and the display 36 may also be integrated into a headpiece 54, such as is illustrated in FIG. 5, rather than being attached to a hard hat 30. This configuration is particularly desirable in those applications where hard hats are not required, such as in telecommunications closets or the like.

Figure 6A:
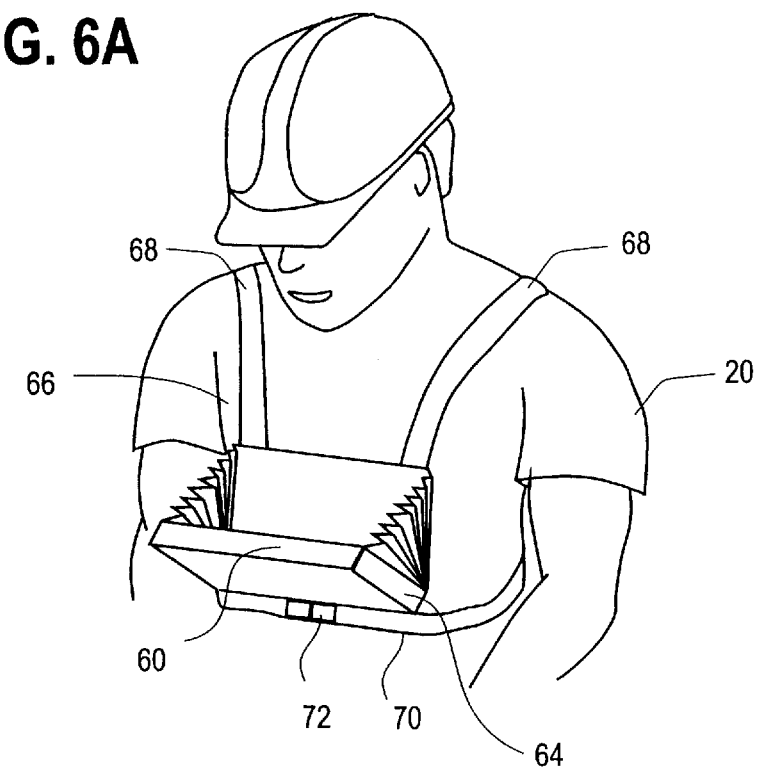
FIGS. 6A–6C are pictorial views of a chest mounted display embodiment of the remote unit.
Figure 6B:
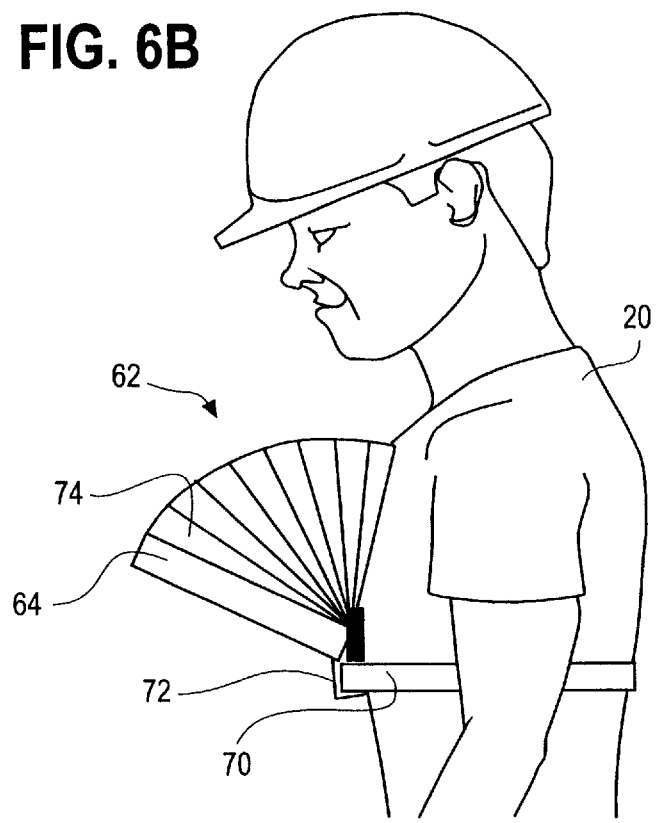

Depending on the amount of information that is intended to be displayed on the display, it may be desirable to make the display from a larger size such that the technician may more readily ascertain the details when measuring and adjusting the telecommunications system. For these situations, a display 60 is preferably incorporated into a chest-mounted unit 62, as most clearly illustrated in FIGS. 6A and 6B.

The display 60 is mounted in a fabric case 64 attached to a harness 66 worn by the technician 20. The harness 66 preferably includes shoulder straps 68 and a belt strap 70. The harness 66 is attached to the shoulder straps 68 and to one end of the belt strap 70. The ends of the belt strap 70 are provided with buckle 72, which allows the technician 20 to easily put on and remove the chest-mounted unit 62.

The case 64 is preferably provided with a fabric accordian 74 on opposite sides of the display 60. The accordian 74 allows the display 60 to be pivoted to a comfortable viewing position. When not in use, the display 60 is preferably folded against the technician's chest and held by hook-and-loop fasteners (not shown) or similar such fasteners.

Figure 6C:
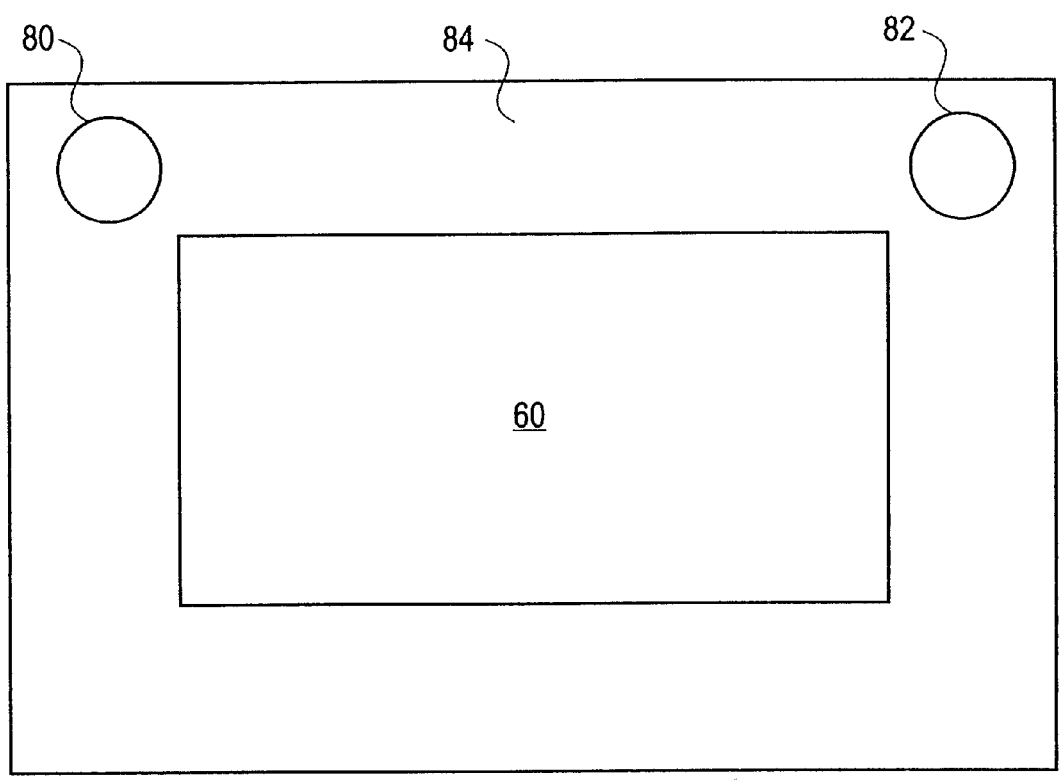

When the display 60 is used in the chest-mounted configuration, a microphone 80 and speaker 82 are preferably integrated into a bezel 84 that surrounds the display 60, as most clearly illustrated in FIG. 6C. This configuration thereby enables the control system 10 to be used with the technician attaching any components to his or her head.

Figure 7:
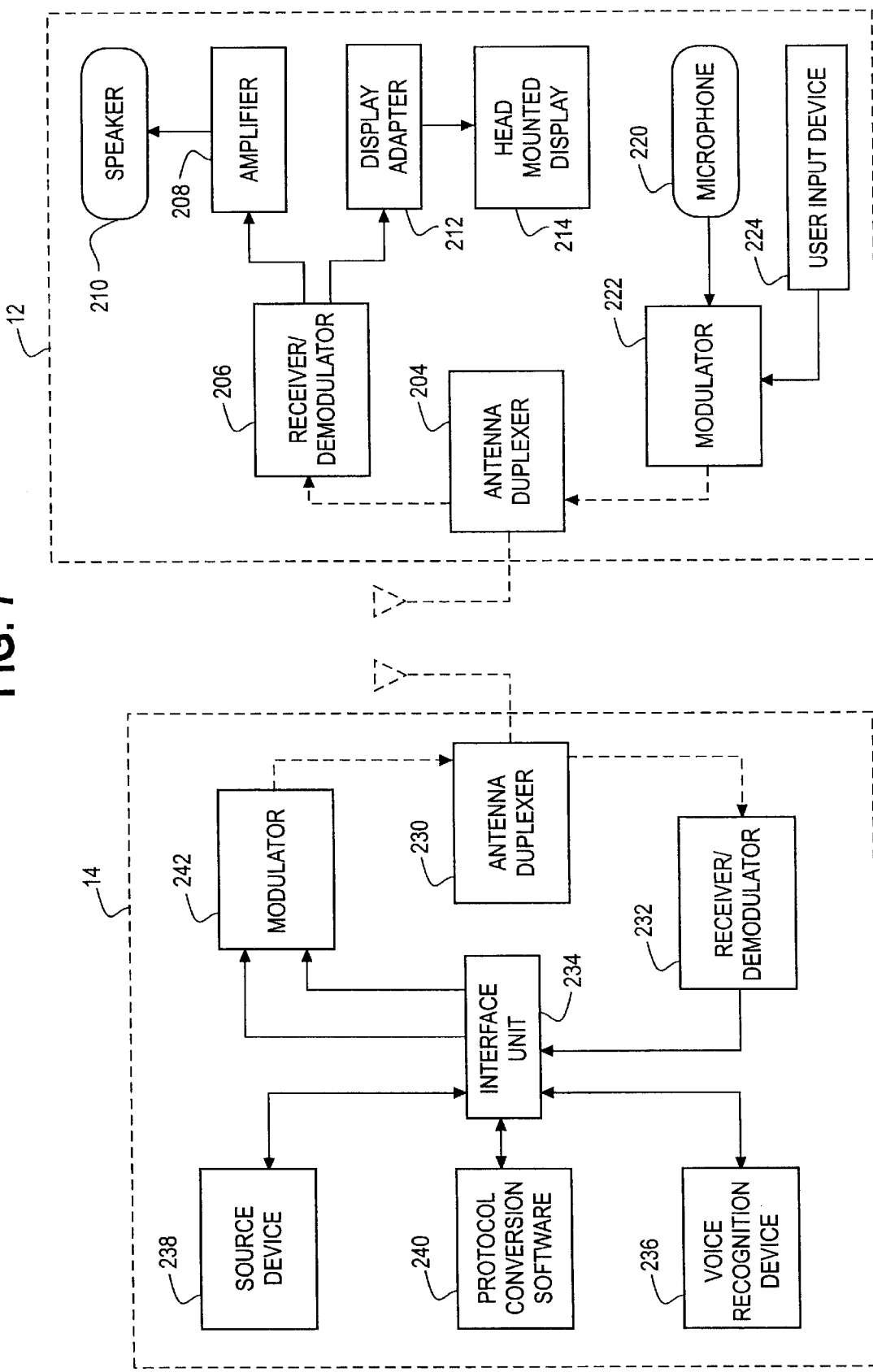
FIG. 7 is a block diagram of the circuitry for the hands free electrical signal measuring device according to the invention.

Communication between the remote unit 12 and the base unit 14 is preferably accomplished through a duplexed communication system, such as is illustrated in FIG. 7. Communications between the remote unit 12 and the base unit 14 are routed through an antenna duplexer 204, which is preferably capable of simultaneously receiving and transmitting. The antenna duplexer 204 routes an incoming RF signal through a receiver/demodulator 206 that converts the RF signal into an electrical signal. The receiver/demodulator 206 also separates the audio portion of the incoming RF signal from the video portion of the incoming RF signal.

The audio portion of the signal is routed to an amplifier 208 and then a speaker 210. The video portion of the signal is routed to a display adapter 212 and then to a display 214.

Speech commands from the user are received by a microphone 220 and then routed to a modulator 222. User input commands 224 such as through the cursor control 44 are also routed to the modulator 222. The modulator 222 converts the speech and user input commands into an RF signal, which is then routed to the antenna duplexer 204.

The RF signal is then transmitted to an antenna duplexer 230 in the base unit 14. A person of ordinary skill in the art will appreciate that there are other techniques for conducting wireless communication between the remote unit 12 and the base unit 14, such as infrared and lasers.

The antenna duplexer routes the incoming RF signal to a receiver/demodulator 232, which converts the RF signal into an electrical signal. The electrical signal is routed to an interface unit 234. The interface unit 234 is operably linked to a voice recognition unit 236 that translates the words spoken by the user into commands that control the operation of the measurement and adjustment process.

The interface unit 234 is also linked to a source device 238 whose signal is used for the measurement and adjustment process. The interface unit 238 includes a port (not shown) that allows the interface unit 234 to readily connect with the source device 238. Examples of suitable ports are an RS232 connector or a general purpose interface bus.

Depending on the type of data provided by the source device 238, it may be necessary for the interface unit 234 to also include protocol conversion software 240 to convert the data received from the source device 238 into a format that can be used by the control system of the present invention.

The interface unit 234 analyzes the data received from the source device 238 and the voice recognition device 236 and prepares video and audio signals. The signals are directed to a modulator 242 where the signals are converted to an outgoing RF signal. The outgoing RF signal is routed to the antenna duplexer 230 for transmission to the remote unit 12.

It will be appreciated that the architecture of the remote system unit 12 and the base unit 14 are preferably quite similar to that of a personal computer, either a desktop or a lap top personal computer. This configuration allows the use of industry standard components and therefore, economies of manufacture. The remote system unit 12 may also contain a serial port for directly programming the remote system unit 12.

An example of a suitable speech recognition chip for use with the present invention is the Interactive Speech model RSC-164 general purpose microcontroller incorporating speech recognition and speech synthesis. This chip may be obtained from Sensory, Inc., of Sunnyvale, Calif.

The on-chip speech recognition algorithms implemented in the RSC-164 chip reach an accuracy of greater than 96% for speaker-dependent recognition. Speaker-independent recognition requires on-chip or off-chip ROM to store the words to be recognized. The RSC-164 chip has both continuous listening and consecutive entry modes of operation. Continuous listening allows the chip to continuously listen for a specific word. In this mode, the electrical signal measurement device "activates" when a specific word, preceded by quiet, is spoken. In continuous entry mode, the chip handles several speech inputs in succession as long as each input is surrounded by one-half second of quiet.

The electrical signal measuring device according to this invention is controlled by means of spoken words using speech recognition system running on the CPU supported by the speech recognition and speech synthesis chip. The speech recognition and speech synthesis chip used in the system unit according to a preferred embodiment of the invention support three speakers, with provision for adding an additional speaker after first deleting a current speaker.

In use, there are a few speaker independent commands and several speaker dependent commands that are recognized by the speech recognition software. The software is activated by the speaker's speech and responds to the spoken words "one", "two" and "three" to activate the speaker dependent recognition routines for the first, second and third speaker, respectively. The actual spoken words, menu structure and training routines are custom written and compiled for the specific application. Additionally, user feedback/ enunciation in the form of speech synthesis are provided by the speech recognition and speech synthesis chip.

The basic flow diagram for the speech recognition control is shown in FIGS. 8A–D. In this diagram, the user's spoken words are shown in dotted line boxes and computer implemented software functions are shown in solid line boxes. The software-implemented actions taken in response to spoken words are set out in tables below.

During the power on sequence in function block 300, a test is made in decision block 302 to determine if the speech recognition is allowed. If not, the system is enabled for manual operation only in function block 304. However, assuming that speech recognition is allowed, a further test is made in decision block 306 to determine if speech recognition was active at power off. If speech recognition is not enabled, the system is enabled for manual operation in fumction block 308 and, in function block 310, the speaker independent speech command function is enabled. The system then awaits the detection of the user's speech.

When the user speaks, the system prompts the user in function block 312 to identify him or herself as one of a predetermined number of speakers this particular instrument will recognize. In a specific implementation, the speech recognition has the capability to recognize the speech of three different users. These three users may identify themselves by, for example, speaking the words "one", "two" or "three".

After prompting the user, the system awaits identification of the user by spoken words "one", "two" or "three". Once the user has identified him or herself, a test is made in decision block 314 to determine if there is a word match. If no match is detected, the process loops back to function block 308 where the system remains enabled in the manual operation mode. When a word match is detected, a further test is made in decision block 316 to determine if there is user confirmation; that is, does the spoken word "one", "two" or "three" match the user speaking that word. If a word match is not detected, the process loops back to function block 308 where the system remains enabled in the manual operation mode. When user confirmation is obtained, the system enables the speech recognition routines for the selected user in function block 318. At this point, the speech recognition mode as well as the manual of operation mode are enabled for the selected user in function block 320, and the system enters the operational level word line generally denoted by the heavy line 322.

Returning to decision block 306, if speech recognition was active at power off, a further test is made in decision block 324 to determine if the system was set for a default user. If system was not set for the default user, the process goes to function block 308 to identify the current user. If the system had been set for a default user, the speech recognition for the default user is enabled in function block 326, and the system enters the operational level word line 322, thus avoiding the need to identify the user with each power on.

As mentioned earlier, manual operation is basically a back up to the speech recognition mode of operation. Generally, manual operation is conventional using the cursor control 44 (FIG. 3) to move a displayed cursor and select a command or function by depressing the cursor control. In a specific implementation of the invention, there may be the same or more commands and functions that are selected manually as selected in speech recognition operation, but the important novel features of the invention are in the speech recognition mode of operation. Since the manual operation is conventional, no further description is necessary for those skilled in the art to practice that aspect of the invention.

There are several commands or functions controlled by speaker dependent commands. These commands are shown in FIGS. 8A–8D and FIG. 9 and set out in more detail in tabular form below. The first of these that will be discussed is the TUNE function that is activated by the spoken word "tune". As seen in Table 1 below and with reference to FIG. 8A, the tune command is laid out in a manner analogous to a pull down or fly out menu on a display screen, except that activation of the various functions and selections of operations in the "menu" is done by spoken command rather than selection by a pointing cursor controlled by the cursor control 44 (similar to a mouse or track ball). It will be appreciated, however, that each of these commands may be selected using the pointing cursor.

Figure 8A:
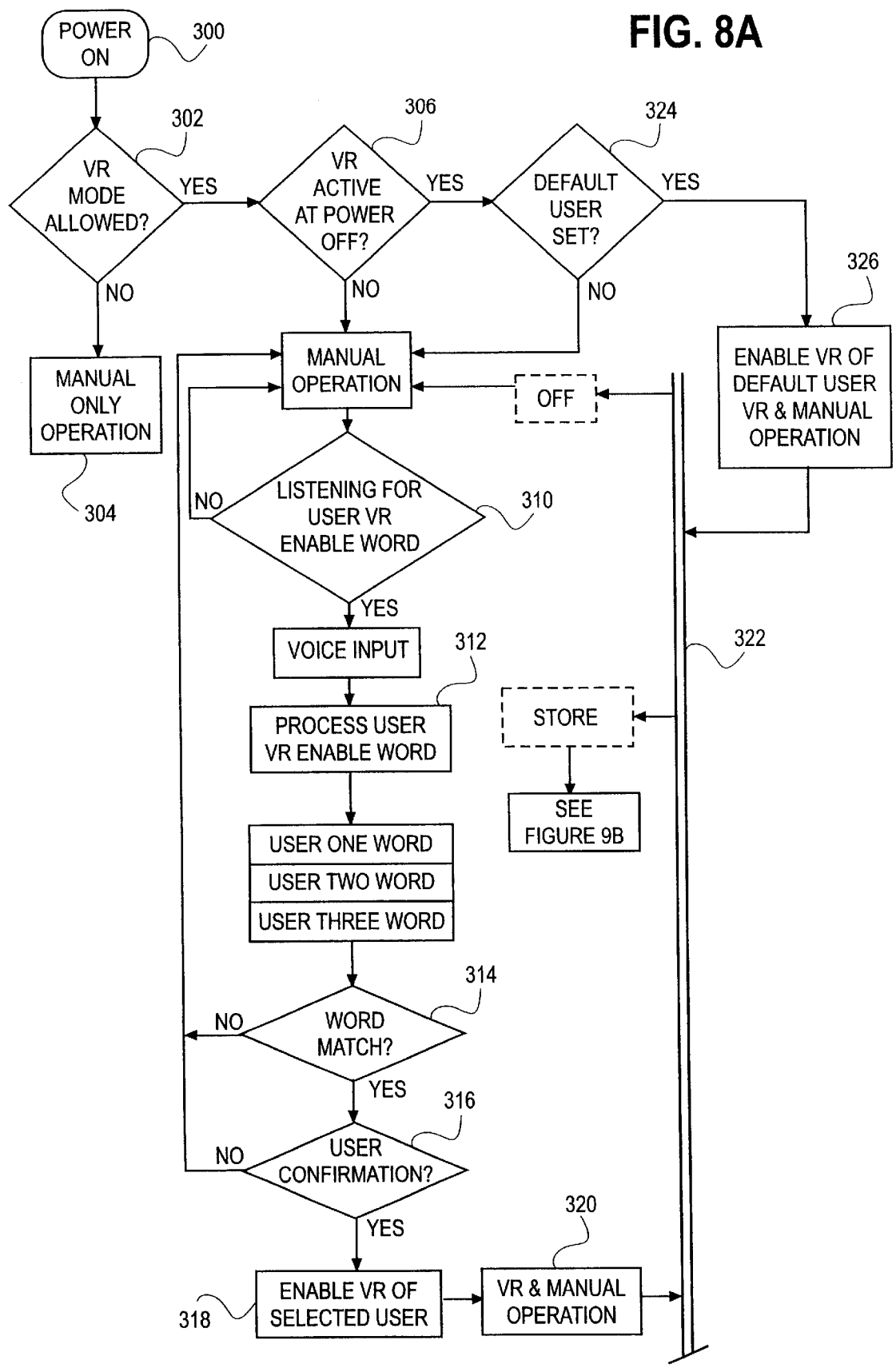
FIGS. 8A–D are flow diagrams of the speech recognition command control process implemented on the electrical signal measuring device of the invention.
Figure 8B:
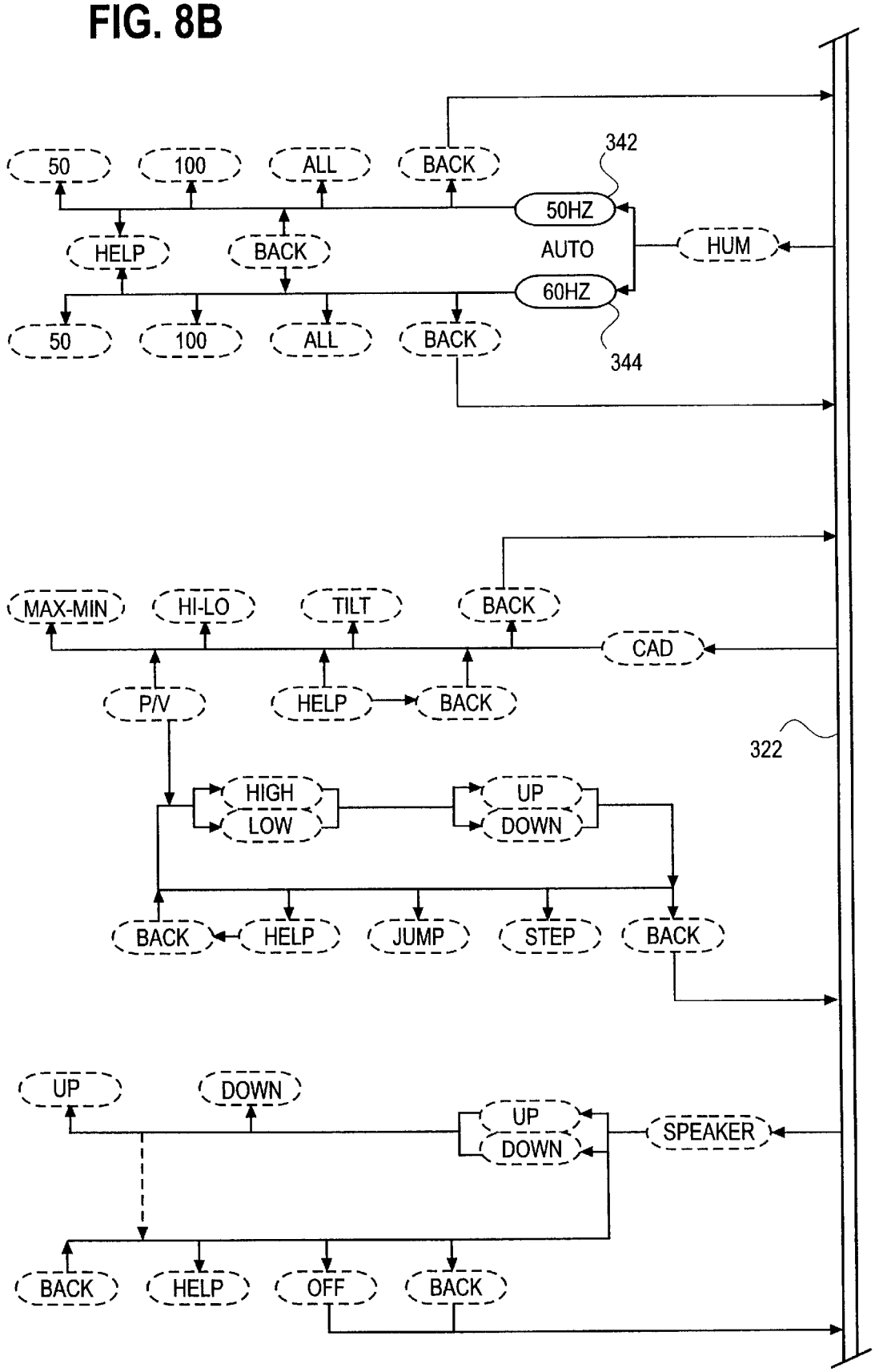
Figure 8C:
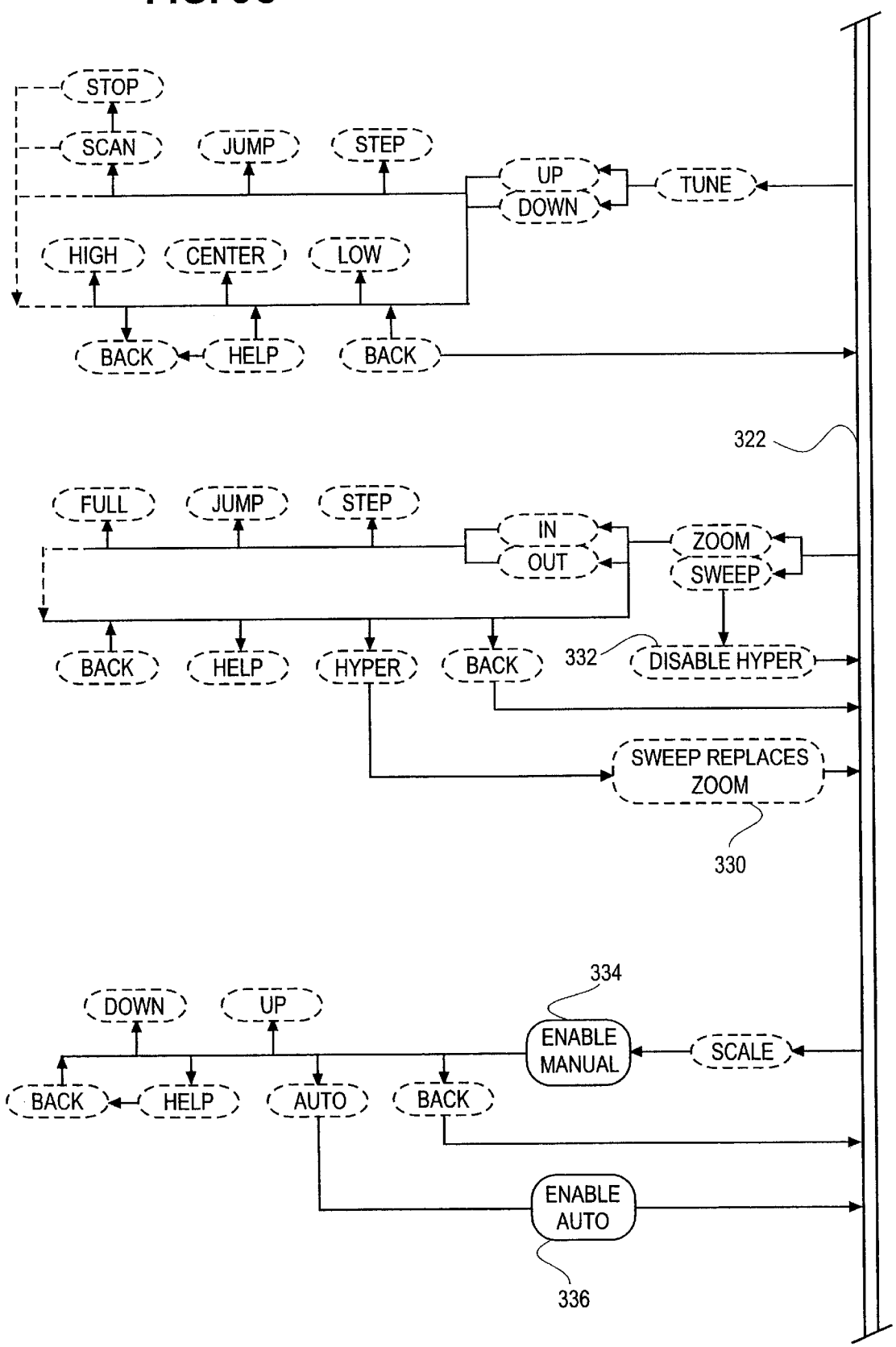

In the command menu for the TUNE function as show in FIG. 8C and Table 1, the system recognizes the spoken commands "up" and "down" to control the direction of cursor movement and increase or decrease the frequency being tuned. These spoken commands are augmented by the spoken commands "step", "jump" and "scan". The scan operation is stopped by the spoken word "stop". Other commands recognized are "low", "center" and "high" for cursor movement. There is also a "help" command that results in the display of a help screen about the TUNE function. Clearing of the help screen is accomplished by the spoken command "back". Note that a return to the top level word line 322 is made in response to the spoken command "back".

TABLE 1

Tune Function Commands

| Command | Function |
| --- | --- |
| TUNE | Activate tune mode |
| LOW | Move cursor to first channel of channel plan, scroll if needed |
| CENTER | Move cursor to mid channel of channel plan, scroll if needed |
| HIGH | Move cursor to last channel of channel plan, scroll if needed |
| UP | Set direction of cursor movement, increase frequency |
| DOWN | Set direction of cursor movement, decrease frequency |
| JUMP | Move cursor in set direction by 10 channels, refresh |
| STEP | Move cursor in set direction by 1 channel, refresh |
| SCAN | Enable scan mode in set direction, scroll if needed |
| STOP | Disable scan mode, cursor at stop location |
| BACK | Deactivate tune mode, clear help screen |
| HELP | On screen help about tune mode |

The next function is ZOOM. The spoken command hierarchy for this function is shown in FIG. 8C and set out in Table 2 below. The spoken commands recognized in support of this function include "in" and "out" for respectively expanding and compressing the direction of zoom. These commands are augmented by the commands "step", "jump" and "full". A further command, "hyper", causes the system to enter a hyper mode and replaces a sweep mode in function block 330. In response to the spoken command "sweep", the hyper mode is disabled and sweep mode is replaced by the zoom mode in fUnction block 332. A "help" command results in the display of a help screen about the ZOOM function. Clearing of the help screen is accomplished by the spoken command "back". A return to the top level word line 322 is made in response to the spoken command "back".

TABLE 2

Zoom Function Commands

| Command | Function |
| --- | --- |
| ZOOM | Activate zoom mode |
| IN | Set direction of zoom, expand |
| OUT | Set direction of zoom, compress |
| FULL | Display max channels when "out", single channel when "in" |
| STEP | Zoom in/out by 1 zoom increment, refresh display |
| JUMP | Zoom in/out by 5 zoom increments, refresh display |
| HYPER | Enable hyper, return to top level, replace "zoom" with "sweep" |
| BACK | Deactivate zoom mode |
| HELP | On screen help about zoom mode |
| SWEEP | Disable hyper mode, replace "sweep" with "zoom", return to top level |

The next function is SCALE as shown in FIG. 8C and in the following Table 3. The "manual" scale range is enabled by the spoken command "scale" in function block 334. In this mode, the user may speak the words "up" and "down" to navigate the scale. In response to the spoken command "auto", the manual scale range is deactivated in function block 336. A "help" command results in the display of a help screen about the SCALE function. Clearing of the help screen is accomplished by the spoken command "back". A return to the top level word line 322 is made in response to the spoken command "back".

TABLE 3

Scale Function Commands

| Command | Function |
| --- | --- |
| SCALE | Activate manual scale mode |
| UP | Increment amplitude display up 1 division, refresh display |
| DOWN | Increment amplitude display down 1 division, refresh display |
| AUTO | Deactivate manual range, activate auto range, return to top level |
| BACK | Hold manual setting, deactivate range mode, return to top level, clear help screen |
| HELP | On screen help about range mode |

Figure 8D:
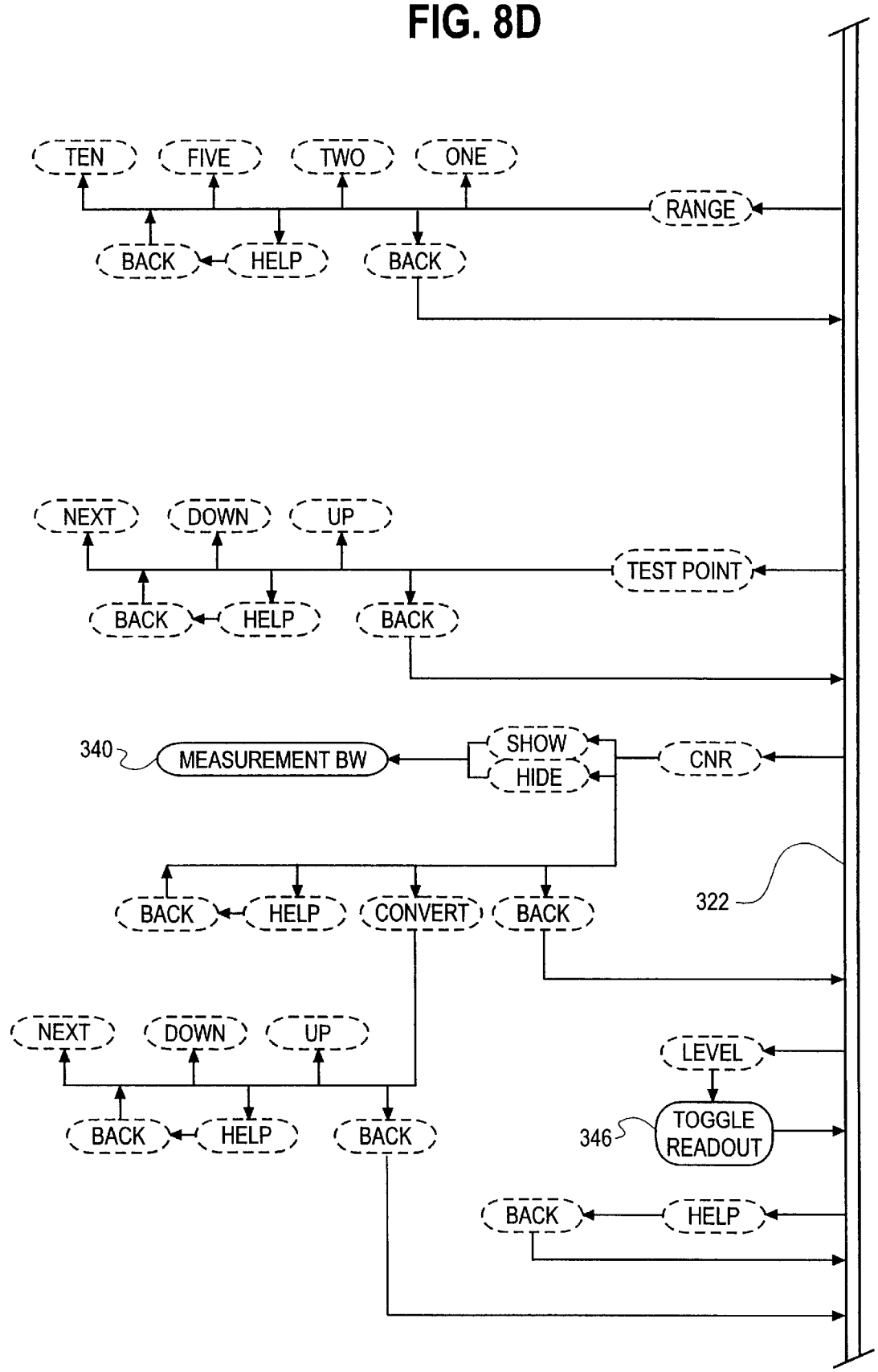

The next function is RANGE as shown in FIG. 8D and in the following Table 4. The system responds to spoken range increments of "one", "two", "five" and "ten". A "help" command results in the display of a help screen about the RANGE function. Clearing of the help screen is accomplished by the spoken command "back". Again, a return to the top level word line 322 is made in response to the spoken command "back"

TABLE 4

Range Function Commands

| Command | Function |
| --- | --- |
| RANGE | Activate range mode |
| ONE | Set amplitude scale to 1 dB/div, refresh display |
| TWO | Set amplitude scale to 2 dB/div, refresh display |
| FIVE | Set amplitude scale to 5 dB/div, refresh display |
| TEN | Set amplitude scale to 10 dB/div, refresh display |
| BACK | Hold scale setting, deactivate scale mode, return to top level, clear help screen |
| HELP | On screen help about range mode |

The next function is TEST POINT as shown in FIG. 8D and in the following Table 5. The system responds to spoken navigation commands of "up", "down" and "next". A "help"

command results in the display of a help screen about the TEST POINT function. Clearing of the help screen is accomplished by the spoken word "back". Again, a return to the top level word line 322 is made in response to the spoken command "back".

TABLE 5

Test Point Function Commands

| Command | Function |
| --- | --- |
| TEST POINT | Activate test point mode |
| UP | Increment selected digit up |
| DOWN | Increment selected digit down |
| NEXT | Select next digit to right, wrap around |
| BACK | Set test point offset, deactivate test point mode, return to top level, clear help screen |
| HELP | On screen help about test point mode |

The next function is the comparative analysis display (CAD) as shown in FIG. 8B and the following Table 6. The system then responds to spoken commands of "tilt", "hi-lo" and "max-min". Again, a return to the top level word line is made in response to the spoken command "back". The spoken command "PV" branches to allow further navigation, in which case the system responds to the spoken command of "high", "low", "up", "down", "jump", and "step". A "help" command, which may be invoked in either branch, results in the display of a help screen about the CAD function. Clearing of the help screen is accomplished by the spoken command "back". The spoken command "back" to return to the top level word line 322.

TABLE 6

CAD Function Commands

| Command | Function |
| --- | --- |
| CAD | Activate comparative analysis display mode |
| HI-LO | Enable hi-lo display, disable tilt, max-min, p/v |
| TILT | Enable tilt display, disable hi-lo, max-min, p/v |
| MAX-MIN | Enable max-min display, disable tilt, hi-lo, p/v |
| P/V | Enable p/v display, disable tilt, hi-lo, max-min |
| HIGH | Select upper horizontal cursor |
| LOW | Select lower horizontal cursor |
| UP | Set direction of selected cursor to up |
| DOWN | Set direction of selected cursor to down |
| STEP | Move selected cursor in set direction by 1 pixel |
| JUMP | Move selected cursor in set direction by 10 pixels |
| BACK | Hold cursor positions, disable control, return to top level, clear help screen |
| HELP | On screen help about CAD or p/v mode |

The next function is CNR (carrier to noise) as shown in FIG. 8D and in the following Table 7. The system then responds to the commands "show" and "hide", and in response to the spoken commands "show" and "hide", a bandwidth measurement is made in function block 340. A "help" command results in the display of a help screen about the CNR fumction. Clearing of the help screen is accomplished by the spoken command "back". A return to the top level word line 322 is made in response the spoken command "back". Alternatively, branch is made in response to the spoken word "convert", in which case the system responds to the spoken words "up", "down" and "next" to navigate and, as in the first branch. A "help" command results in the display of a help screen about the CNR function. Clearing of the help screen is accomplished by the spoken command "back". To return to the top level word line 322, the user speaks the command "back".

TABLE 7

CNR Function Commands

| Command | Function |
| --- | --- |
| CNR | Activate CNR mode, initiate measurement |
| SHOW | Enable display of bandwidth used in measurement |
| HIDE | Disable display of bandwidth used in measurement |
| CONVERT | Activate convert function |
| UP | Increment selected digit up, update converted figure |
| DOWN | Increment selected digit down, update converted figure |
| NEXT | Select next digit to right, wrap around |
| BACK | Deactivate convert function, return to top level, clear help screen |
| HELP | On screen help about the CNR mode or convert function |

The next function is HUM as shown in FIG. 8B and in the following Table 8. In response to the spoken command "hum", the system automatically switches between 50 Hz mode in function block 342 or 60 Hz mode in function block 344, depending on the detected power line frequency. In either mode, the system responds to the spoken commands of "50" (or "60"), "100" (or "200") and "all". A "help" command results in the display of a help screen about the HUM function. Clearing of the help screen is accomplished by the spoken command "back". A return to the top level word line 322 is made in response to the spoken command "back".

TABLE 8

HUM Function Commands

| Command | Function |
| --- | --- |
| HUM | Activate HUM mode, initiate measurement |
| 50 | Enable 50 Hz measurement (if sync is 50 Hz), disable 100, all |
| 100 | Enable 50 Hz measurement (if sync is 50 Hz), disable 50, all |
| 60 | Enable 60 Hz measurement (if sync is 60 Hz), disable 120, all |
| 120 | Enable 120 Hz measurement (if sync is 60 Hz), disable 60, all |
| ALL | Enable all frequency measurement, disable 50, 100, 60, 120 |
| BACK | Enable all frequency, deactivate HUM mode, return to top level, clear help screen |
| HELP | On screen help about the HUM mode |

The next function is SPEAKER as shown in FIG. 8B and in the following Table 9. The system then responds to the commands to select either "audio" or "video", and thereafter to the commands "up" and "down" to navigate and to "off" to deactivate speaker mode and enable sweep before returning to top level word line 322. A "help" command results in the display of a help screen about the SPEAKER function. Clearing of the help screen is accomplished by the spoken command "back". A return to the top level word line 322 is made in response to the spoken command "back".

TABLE 9

Speaker Function Commands

| Command | Function |
| --- | --- |
| SPEAKER | Activate speaker mode, disable sweep, loudness at 2 (1–15) |
| AUDIO | Select TV audio carrier, not available on digi, data or fm |
| VIDEO | Select TV video carrier, not available on digi, data or fm |
| UP | Increase loudness 1 increment |
| DOWN | Decrease loudness 1 increment |
| OFF | Deactivate speaker mode, enable sweep, return to top level |

TABLE 9-continued

Speaker Function Commands

| Command | Function |
|---|---|
| BACK | Speaker mode active, disable sweep, return to top level, clear help screen |
| HELP | On screen help about the speaker mode |

Figure 9:
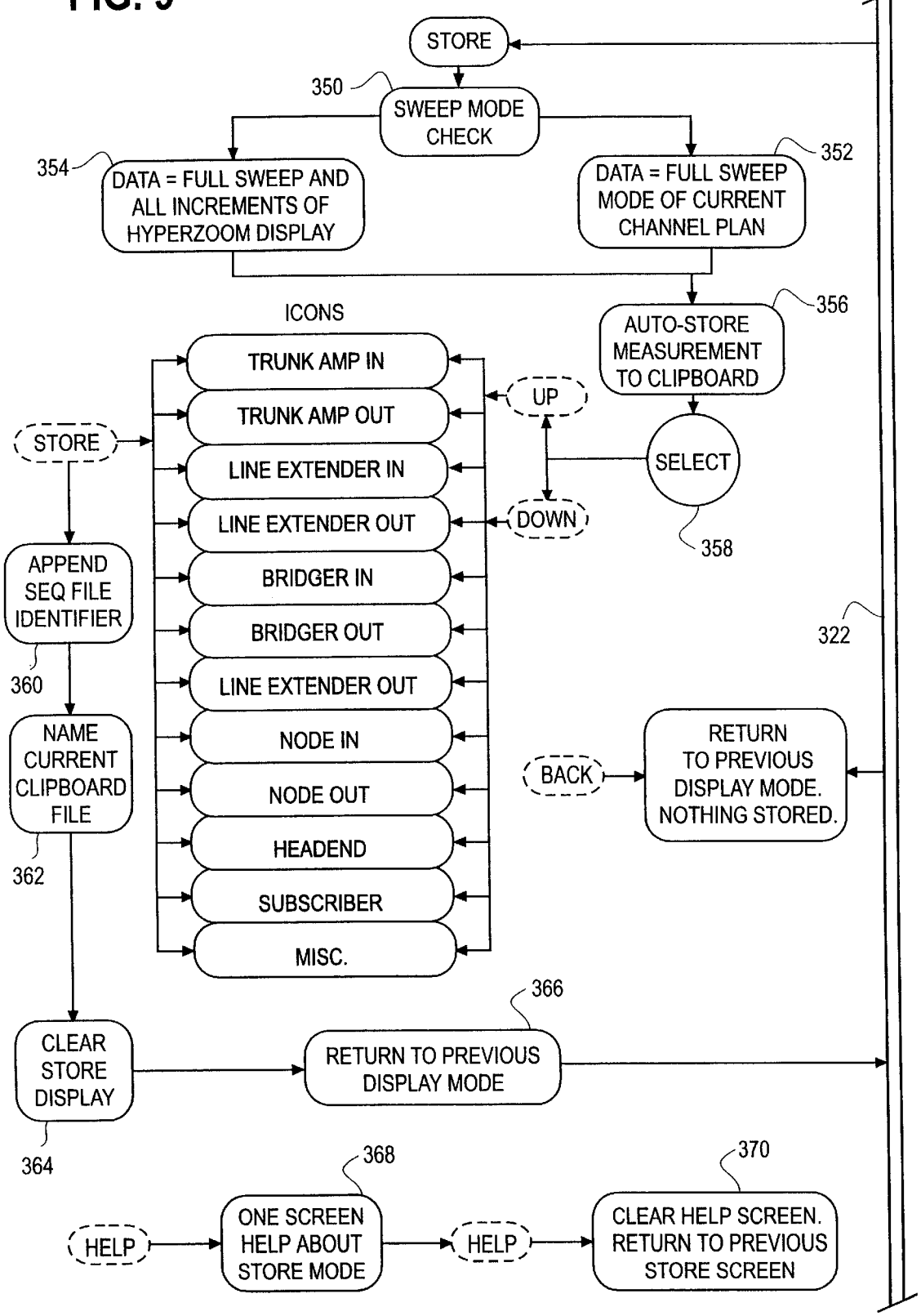
FIGS. 9 is a flow diagram of a portion of the speech recognition command control process implemented on the electrical signal measuring device of the invention.

There are three other functions shown in FIGS. 8D and 9 to which the speech recognition system responds from the top level word line 322. These functions are invoked by the spoken commands "level", "help" and "store". In response to the spoken command "level", a readout is toggled in function block 346, and a return is made to the operational level word line 322.

The "help" command results in the display of a help screen about the operational level; that is a description of the various functions that may be accessed from the operational level word line 322. Clearing of the help screen is accomplished by the spoken word "back".

The other fuiction invoked by a spoken command is the STORE function, which is illustrated in FIG. 9 and summarized in Table 10. This command is used for storing measured data that may later be downloaded to a central data storage for analysis. In response to the "store" command, the system first checks the sweep mode in function block 350 to determine if in the hyperzoom mode. If in hyperzoom mode, the data to be stored is the fill sweep and all increments of the hyperzoom display in block 352. If not in hyperzoom mode, the data to be stored is the full sweep mode of the current channel plan in block 354. In either case, the system then enters the auto-store measurement to the clipboard in function block 356.

Next, the system prompts the user to select from several displayed icons a name for the measurement to be stored. The user navigates among the several icons with the spoken commands "up" and "down". When the desired icon is highlighted, the user then speaks the command "store" again and, in response, the system appends a sequence file identifier to the measured data in function block 358 and names the current clipboard file in function block 360 according to the selected icon.

Then, the system clears the store display in function block 362 and returns to the previous display mode in function block 364. If during the store command routine and before speaking the command "store" for the second time the user were to decide not to store the data in the current clipboard file, the user need only to speak the command "back" and a return is made in function block 366 to the previous display mode. The "help" command is available from any point in the store mode and results in the display of a help screen 368 about the STORE function. Clearing of the help screen in function block 370 is accomplished by the spoken command "back".

TABLE 10

Store Function Commands

| Command | Function |
|---|---|
| STORE | Activate store mode |
| UP | Increment file type selection up one line in list |
| DOWN | Decrement file type selection down one line in list |

TABLE 10-continued

Store Function Commands

| Command | Function |
|---|---|
| STORE | Store data as selected file type with auto extension, return to main display |
| BACK | Exit store mode, no data saved, exit help screen |
| HELP | On screen help about the store mode |

Speech synthesize responses/messages from the system to the user include the following:
  PLEASE SPEAK LOUDER (below speech recognition threshold)
  PLEASE REPEAT (confidence level below a predetermined level)
  PLEASE MAKE SELECTION (when a selection is needed to continue)
  PLEASE VERIFY USER (after a predetermined number of recognition errors)
  WARNING, LOW BATTERY
  WARNING, DISPLAY TIME OUT (power management active)
  WARNING, POWER SHUT DOWN IN ONE MINUTE (power management active)
  WELCOME (power on message)
  CALIBRATION NOW DUE (on power up after recalibration date)
  FREE MEMORY IS LOW (during file operations)
These messages are synthesized by the speech recognition and speech synthesis chip under the control of the CPU. These messages are transmitted to the earphone (or speaker).

A key feature of the invention is the display screen displayed to the technician on the display device. This display device uses a graphical user interface (GUI) which, under speech command, allows the user to navigate and select functions. In addition, digitized signal measurements are displayed in a window on the display screen for viewing by the technician.

Each startup operation results in an optional "Welcome" screen (not shown). This screen is followed by a single measurement screen, an example of which is shown in FIG. 4. This screen is specifically designed for use in a signal level meter for measurement of RF signals in a cable television plant.

At the top of the screen illustrated in FIG. 4 is a header that includes several display/activator buttons. In the top center of this screen, a select channel/frequency display/activator button 300 is displayed. This region displays, and allows the selection of, the channel number of frequency. The channel number is displayed as an alpha numeric indicia, while the frequency is displayed as a numeric indicia.

Figure 10A:
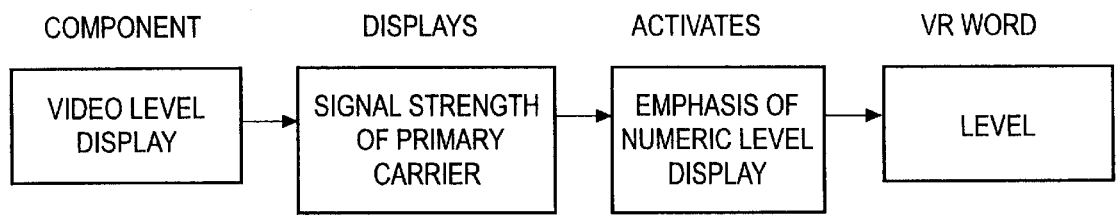
FIGS. 10A–10P show the relationship of the various icons, activities, displays and spoken commands of the main display screen of FIG. 4.

Below and to the left of the display/activator button 300 is a video display/activator button 302 that displays video level of the selected channel/frequency. This screen component has both activator and speech recognition functions. FIG. 10A shows the relation of the video level display and the spoken command word "level".

Figure 10B:
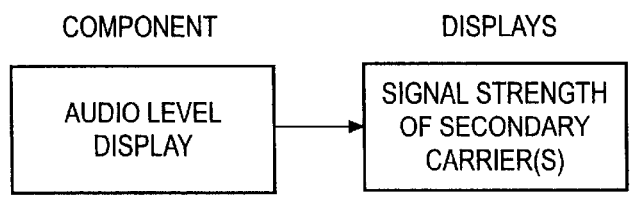

Below and to the right of the display/activator button 300 is an audio level display/activator button 304 that displays the audio level of the selected channel/frequency. This screen component has display only function. FIG. 10B shows the audio level display and its content.

Figure 10C:
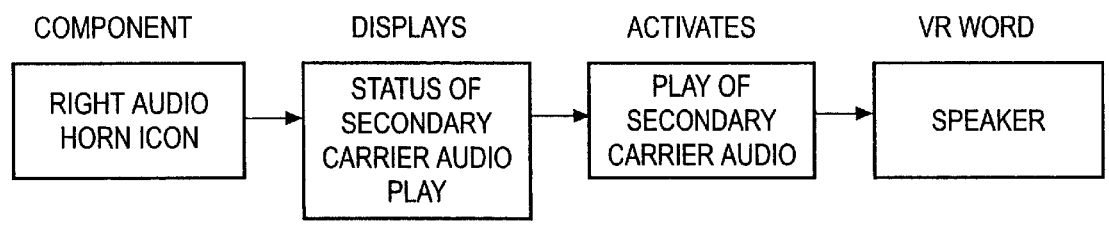

The right audio speaker icon 306 provides activation of frequency modulated (FM) detected primary audio of the selected channel/frequency through the speaker. This screen component has both activator and speech recognition functions. FIG. 10C shows the relation of the right audio horn icon and the spoken command word "speaker".

Figure 10D:
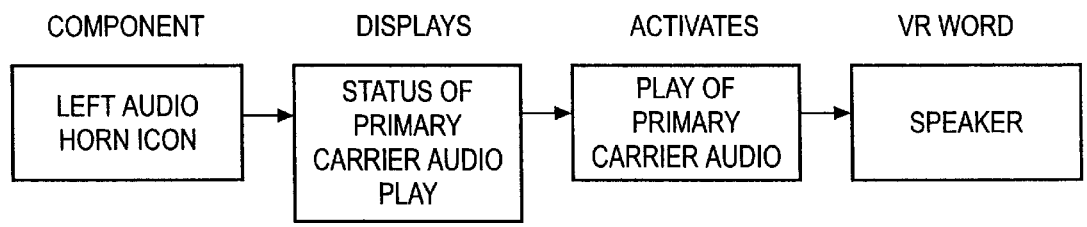

The left audio speaker icon 308 provides activation for a secondary carrier (i.e., synch buzz, dig noise). This screen component has both activator and speech recognition functions. FIG. 10D shows the relation of the left audio horn icon and the spoken command word "speaker".

Figure 10E:
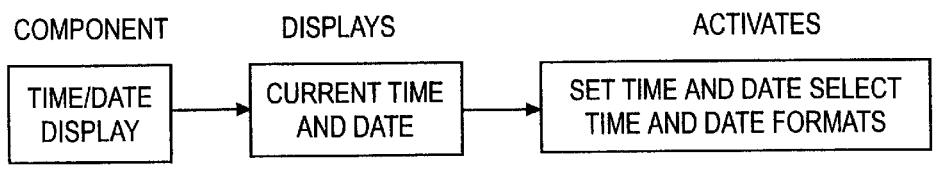

To the left of the left audio speaker icon 308 is a time and date display/activator button 310. This display/activator button displays and allows adjustment of the time and date. This screen component has an activator function but no speech recognition function. FIG. 10E shows the relation of the time and date activator button to its function.

Figure 10F:
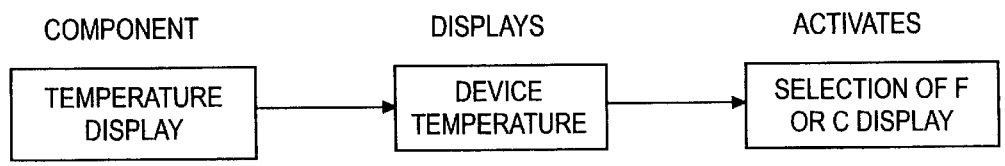

Opposite the time and date activator button 310, and to the right of the right audio speaker icon 306, is a temperature display/activator button 312 that also incorporates an indication of the power remaining, i.e., battery level. This display/activator button displays temperature (default is degrees Fahrenheit) and allows adjustment of the temperature unit of measure. This screen component has an activator function but no speech recognition function. FIG. 10F shows the relation of the temperature activator button to its function. In addition, the display/activator button 312 displays power remaining as a percentage of a full battery charge.

Figure 10G:
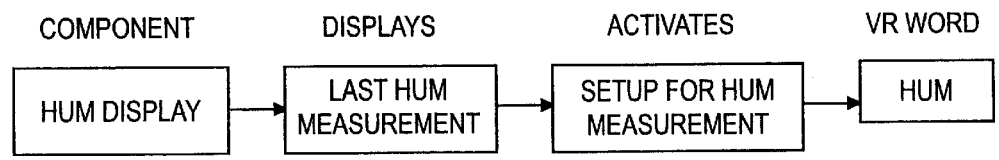

Just above the temperature display/activator button 312 is a HUM display/activator button 314 that displays the calculated HUM measurement. This screen component has both activator and speech recognition functions. FIG. 10G shows the relation of the HUM display and the spoken command word "hum".

Figure 10H:
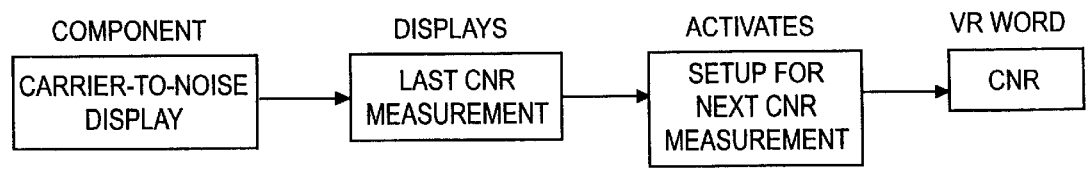

Just above the HUM button 314 is a CNR display/activator button 314 that displays the current measurement value. This screen component has both activator and speech recognition functions. FIG. 10H shows the relation of the carrier to noise ratio display and spoken command word "CNR".

Figure 10I:
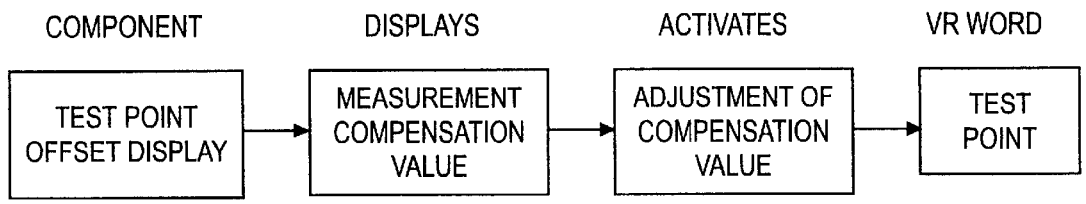

Opposite the CNR button, on the left side of the display is a Test Point (TP) offset display/activator 318 that displays a measurement compensation value. This screen component has both activator and speech recognition functions. FIG. 10I shows the relation of the test point offset display and the spoken command word "test point".

Just below the test point button 318 is a comparative analysis display/activator (CAD) button 320 that displays the following measurements:
(a) HI-LO—the difference between the high "pilot" carrier and the low "pilot" carrier.
(b) TILT—a graphic representation of the level difference between the high "pilot" carrier and the low "pilot" carrier.
(c) P/V (Peak to Valley)—the difference between the highest carrier and the lowest carrier.
(d) MAX-MIN—the difference between the highest level carrier and the lowest level carrier.

Figure 10J:
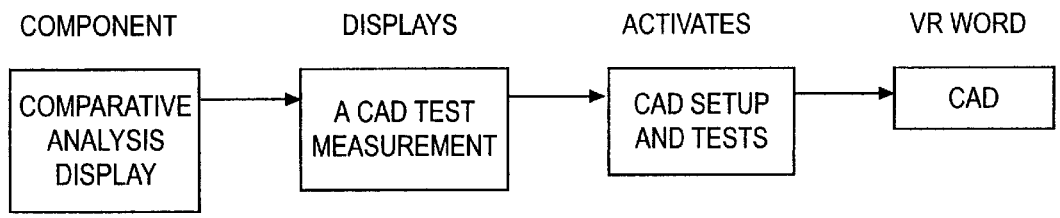

This screen component has both activator and speech recognition functions. FIG. 10J shows the relation of the comparative analysis display and the spoken command word "CAD".

Figure 10K:
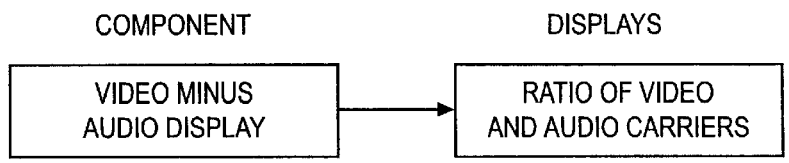

Completing this header display is a video minus audio (V-A) display 322. This screen component has a display only function. FIG. 10K shows the content of the display.

Figure 10L:
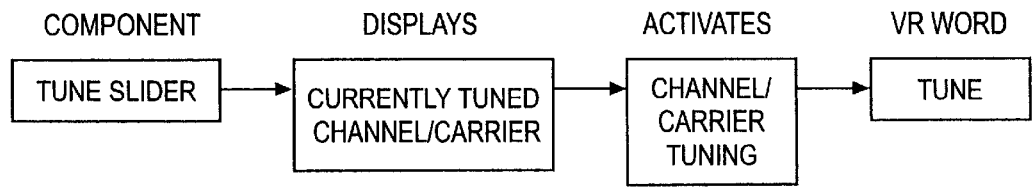

The main measurement display 330 provides a graphic interpretation of the measurement spectrum, in this case a sampled spectrum as described in more detail in Braun et al., U.S. Pat. No. 4,685,065, which is assigned to the assignee of the present application. Below the main measurement display window 330 are a tune slider 332 and a zoom slider 334. These screen components both have activator and speech recognition functions. FIGS. 10K and 10L, respectively, show the relation of the tune slider and the zoom slider and the spoken command words "tune" and "zoom".

Figure 10M:
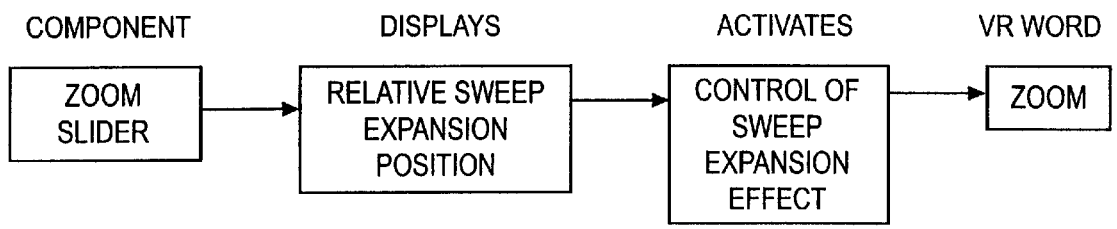
Figure 10N:
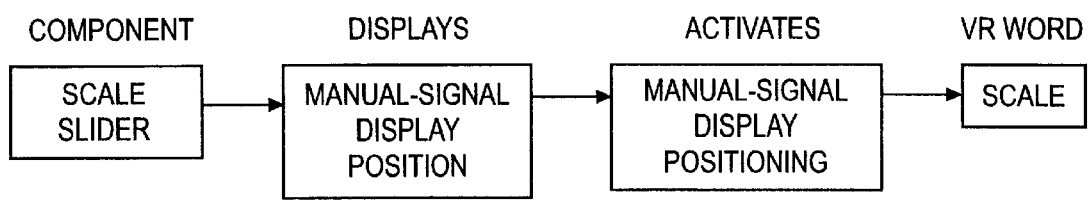

To the left of the main measurement display window 330 are a scaling slider 336 and a range slider 338. These screen components both have activator and speech recognition functions. FIGS. 10M and 10N, respectively, show the relation of the scale slider and the range slider and the spoken command words "scale" and "range".

Figure 10O:
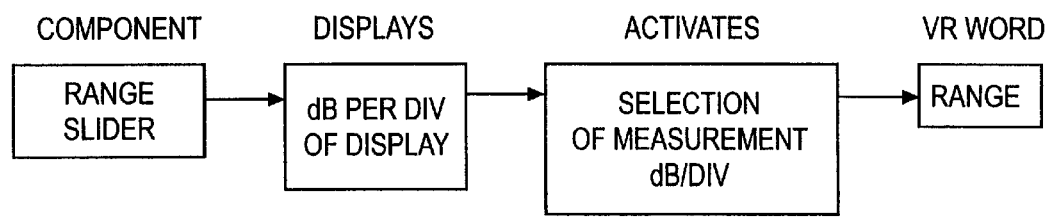

To the right of the main measurement display windows 330 are several icons. The first icon is a logo icon 340 that incorporates a facsimile of a globe that is displayed as spinning when the unit is powered on and serves as a gateway to (a) user help, (b) user manual, (c) guided tour, (d) cable calculator, (e) "get info". This screen component has only an activator function. FIG. 10O shows the relation of the logo icon to the activities that may be accessed.

Figure 10P:
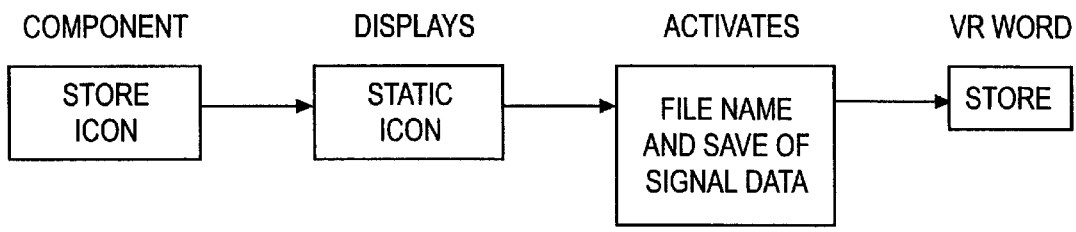

Next is the store icon 342 that serves as a gateway to the store measurement function. This screen component has activator and speech recognition functions. FIG. 10P shows the relation of the store icon and the spoken command word "store".

Below the store icon is a toolbox icon 344 and a delta icon 346. These screen components both have only activator function. The toolbox icon 344 provides access to configuration, file manager and display functions. The delta icon 346 provides access to a delta measurement function.

While the invention have been described with respect to RF measurements for cable television, a person of ordinary skill in the art will appreciate that there are many other measurements of electrical signals that must be done in the communications industry that would benefit form the hands-free speech recognition operation provided by the general principles of the present invention.

What is claimed is:

1. A remote, wireless electrical signal measurement device allowing one person to measure and adjust components in a communication system, the device comprising:

an unmanned source device, linked to the communication system, the source device being capable of generating a data output and receiving a data input, the output data including communication systems measurement data, the data input including communication system adjustment data;

a base system operably connected to the source device, the base system including an interface unit for interpreting the data output and the data input, a first modulator/demodulator for formatting the interpreted data into a first data signal, and a first antenna for transmitting a first data signal and receiving a second data signal;

a remote system including a second antenna for transmitting the second data signal and receiving the first data signal, a second modulator/demodulator for formatting the first data signal into a demodulated signal for use by a person, an outgoing signal generator, in communication with the second modulator/demodulator for formatting an outgoing signal into the second data signal, such that a person using the remote system can make adjustments to components of the communication system and receive feedback from the unmanned base system as to the efficacy of the adjustments.

2. The remote, wireless electrical signal measurement device of claim 1, including a video display unit integrated into a headpiece.

3. The remote, wireless electrical signal measurement device of claim 1, including a microphone, for generating command signals, integrated into a headpiece.

4. The remote, wireless electrical signal measurement device of claim 2, wherein the visual display unit is attached to a hard hat.

5. The remote, wireless electrical signal measurement device of claim 4, including a speech recognizer for accepting spoken commands through said microphone, said speech recognizer including means to recognize speaker independent words and speaker dependent words.

* * * * *